(12) United States Patent
Zhang (10) Patent No.: US 10,014,847 B2
(45) Date of Patent: Jul. 3, 2018

(54) TRIGGER AND OSCILLATION SYSTEM (71) Applicant: SHENZHEN GOODIX TECHNOLOGY CO., LTD., Shenzhen, Guangdong (CN)

(72) Inventor: Mengwen Zhang, Shenzhen (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/654,795

(22) Filed: Jul. 20, 2017

(65) Prior Publication Data

US 2017/0331461 A1    Nov. 16, 2017

Related U.S. Application Data

(63) Continuation of application No. PCT/CN2016/090470, filed on Jul. 19, 2016.

(30) Foreign Application Priority Data

Jan. 28, 2016    (CN) .......................... 2016 1 0059616

(51) Int. Cl.
*H03K 3/3565*    (2006.01)
*H03B 5/36*    (2006.01)
*H03K 3/012*    (2006.01)

(52) U.S. Cl.
CPC ............ *H03K 3/3565* (2013.01); *H03B 5/36* (2013.01); *H03K 3/012* (2013.01); *H03B 2200/0012* (2013.01)

(58) Field of Classification Search
CPC ................. H03K 3/012; H03K 3/3565; H03B 5/36–5/364; H03B 2200/0012
See application file for complete search history.

(56) References Cited

U.S. PATENT DOCUMENTS 5,034,623 A * 7/1991 McAdams ........... H03K 3/3565
326/62
5,886,556 A    3/1999 Ganger et al.
(Continued)

FOREIGN PATENT DOCUMENTS

CN         1578112 A      2/2005
CN       101488736 A      7/2009
(Continued)

*Primary Examiner* — Patrick O'Neill
(74) *Attorney, Agent, or Firm* — Heslin Rothenberg Farley & Mesiti P.C.

(57) ABSTRACT

A trigger, includes: a first voltage input terminal; a bias voltage input terminal; a first bias transistor having a scaling of N to a first component of an external device; a comparator transistor having a scaling of N to a second component of the external device; a first switch transistor and a second switch transistor; a shunt transistor having a control terminal connected to the first voltage input terminal, a second terminal connected to the second terminal of the second switch transistor, and a first terminal connected to the first terminal of the comparator transistor. The shunt transistor has an enlarging scale of M to the comparator transistor. A voltage output terminal is respectively connected to the second terminal of the first switch transistor, the control terminal of the second switch transistor, and the second terminal of the comparator transistor.

20 Claims, 3 Drawing Sheets (56) References Cited

U.S. PATENT DOCUMENTS

| | | | |
|---|---|---|---|
| 6,127,898 A * | 10/2000 | Naura | H03K 3/0231 326/31 |
| 6,278,336 B1 | 8/2001 | Tinsley et al. | |
| 7,088,196 B2 * | 8/2006 | Ashida | H03K 3/012 331/116 FE |
| 8,829,964 B1 * | 9/2014 | Williams | H03K 3/3565 327/206 |
| 2010/0176892 A1 | 7/2010 | Thompson et al. | |
| 2014/0300400 A1 * | 10/2014 | Zhang | H03K 3/3565 327/298 |

FOREIGN PATENT DOCUMENTS

| | | |
|---|---|---|
| CN | 102904549 A | 1/2013 |
| CN | 103684359 A | 3/2014 |

* cited by examiner

TRIGGER AND OSCILLATION SYSTEM

CROSS-REFERENCE TO RELATED APPLICATIONS

The present application is a continuation of international application No. PCT/CN2016/090470 filed on Jul. 19, 2016, which claims priority of Chinese Patent Application No. 201610059616.5, filed on Jan. 28, 2016, both of which are hereby incorporated herein by reference in their entireties.

TECHNICAL FIELD

The present application relates to the technical field of semiconductors, and in particular to a trigger and an oscillation system.

BACKGROUND

A traditional Schmidt trigger may generate a large peak current in a flipped intermediate state, and this feature causes a high average power consumption for the trigger. In addition, because of the effect of the peak current, an output of a low dropout regulator (LDO) hops, thereby influencing other circuit modules.

In application of a crystal oscillator, to enhance the noise margin of the oscillator, a commonly-used method is to configure a Schmidt trigger at an output terminal of the oscillator. However, since an output of the oscillator is generally approximate to a non-full swing sine wave, the power consumption of the traditional Schmidt trigger may be great. Further, since a positive feedback of the traditional Schmidt trigger is intense, a hysteresis interval is large. If an amplitude of the oscillator is too small, there will be no clock output. Furthermore, for the traditional Schmidt trigger, an upward or downward threshold voltage changes obviously with the manufacture process, and a neutral point of flipping of the traditional Schmidt trigger is about a half of the power voltage. As a result, the duty cycle of the clock is hard to control. In addition, a neutral-point voltage of an input terminal of the oscillator will decline after oscillation of the crystal oscillator is stabilized, which greatly deteriorates the duty cycle of the output clock.

SUMMARY

Some embodiments of the present invention are intended, to a certain extent, to solve at least one of the above problems in the related art.

Accordingly, one objective of some embodiments of the present invention is to provide a trigger, which has the advantages of low power consumption, less interference, adjustable hysteresis feature, rectifiable duty cycle and insensitivity to the manufacture process.

Another objective of some embodiments of the present invention is to provide an oscillation system.

To achieve the above objectives, one embodiment of the present invention provides a trigger. The trigger includes: a first voltage input terminal; a bias voltage input terminal; a first bias transistor which includes a first terminal, a second terminal and a control terminal, wherein the control terminal of the first bias transistor is connected to the bias voltage input terminal, and the first bias transistor is configured to have a scaling of N to a first component of an external device connected to the trigger, N being greater than 0; a comparator transistor which includes a first terminal, a second terminal and a control terminal, wherein the control terminal of the comparator transistor is connected to the first voltage input terminal, and the comparator transistor is configured to have a scaling of N to a second component of the external device connected to the trigger; a first switch transistor and a second switch transistor, each of which includes a first terminal, a second terminal and a control terminal, wherein the control terminal of the first switch transistor is connected to the first voltage input terminal, the first terminal of the first switch transistor is connected to the second terminal of the first bias transistor, and the first terminal of the second switch transistor is connected to the second terminal of the first bias transistor; a shunt transistor which includes a first terminal, a second terminal and a control terminal, wherein the control terminal of the shunt transistor is connected to the first voltage input terminal, the second terminal of the shunt transistor is connected to the second terminal of the second switch transistor, the first terminal of the shunt transistor is connected to the first terminal of the comparator transistor, and the shunt transistor is configured to have an enlarging scale of M to the comparator transistor, M being greater than 0; and a voltage output terminal, wherein the voltage output terminal is respectively connected to the second terminal of the first switch transistor, the control terminal of the second switch transistor and the second terminal of the comparator transistor.

In the trigger according to an embodiment of the present invention, the bias transistor and the comparator of the trigger are configured to respectively scale a first MOS transistor (a bias transistor) and a second MOS transistor of the oscillator in an equal proportion, to determine a neutral-point flipped voltage. Afterwards, a shunt transistor and a comparator transistor are arranged to adjust the hysteresis feature of the trigger and the duty cycle of the output clock of the oscillator, such that a clock output with high noise margin and with the duty cycle approaching 50% is finally acquired. Therefore, power consumption of the trigger may be reduced, interference caused by the peak current to other modules is eliminated, the hysteresis interval is simply controlled, and especially a good rectification effect is achieved for the duty cycle of the crystal oscillator having a current mirror structure. That is, the advantages of low power consumption, less interference, adjustable hysteresis feature, rectifiable duty cycle and insensitivity to the process are achieved.

In addition, the trigger according to the above embodiment of the present invention may have the following technical features.

In some examples, the external device is a crystal oscillator, the first component is a first metal-oxide-semiconductor (MOS) transistor of the crystal oscillator, and the second component is a second MOS transistor of the crystal oscillator.

In some examples, the external device is a bias voltage generation circuit of the crystal oscillator, the first component is a current bias transistor of the bias voltage generation circuit, and the second component is a voltage bias transistor of the bias voltage generation circuit.

In some examples, the bias transistor, the first switch transistor and the second switch transistor are n-channel MOS transistors.

In some examples, the comparator transistor and the shunt transistor are p-channel MOS transistors.

Another embodiment of the present invention provides an oscillation system. The oscillation system includes: an oscillator; and a trigger, wherein the trigger is the trigger as described in the above embodiment of the present invention, and a first voltage input terminal of the trigger is connected to a voltage input terminal of the oscillator.

In the oscillation system according to an embodiment of the present invention, the bias transistor and the comparator of the trigger are configured to respectively scale a first MOS transistor (a bias transistor) and a second MOS transistor of the oscillator in an equal proportion, to determine a neutral-point flipped voltage. Afterwards, a shunt transistor and a comparator transistor are arranged to adjust the hysteresis feature of the trigger and the duty cycle of the output clock of the oscillator, such that a clock output with high noise margin and with the duty cycle approaching 50% is finally acquired. Therefore, power consumption of the trigger may be reduced, interference caused by the peak current to other modules is eliminated, the hysteresis interval is simply controlled, and especially a good rectification effect is achieved for the duty cycle of the crystal oscillator having a current mirror structure. That is, the advantages of low power consumption, less interference, adjustable hysteresis feature, rectifiable duty cycle and insensitivity to the process are achieved.

In addition, the oscillation system according to the above embodiment of the present invention may have the following technical features.

In some examples, when a voltage of the voltage input terminal of the oscillator is a low level signal, the first switch transistor is switched on, the comparator transistor is switched off, the trigger outputs a high level signal, and the second switch transistor is switched off; when the voltage of the voltage input terminal of the oscillator rises to a first voltage, the trigger outputs a low level signal, the second switch transistor is switched on, and the shunt transistor shunts the comparator transistor; when the voltage of the voltage input terminal of the oscillator rises to a second voltage, the first switch transistor is switched off, and the shunt transistor shunts the first bias transistor, wherein the second voltage is greater than the first voltage; and when the voltage of the voltage input terminal of the oscillator gradually reduces from the second voltage, the first switch transistor is switched on, and the shunt transistor shunts the comparator transistor to reduce a flipped voltage of the comparator transistor.

In some examples, the oscillation system further includes a feedback resistor, wherein one terminal of the feedback resistor is connected to the voltage input terminal of the oscillator, and the other terminal of the feedback resistor is connected to a voltage output terminal of the oscillator and the drain of the second MOS transistor of the oscillator.

In some examples, the oscillation system is a crystal oscillation system, and the oscillator is a crystal oscillator.

In some examples, the crystal oscillator is a double-input terminal crystal oscillator or with a single-input terminal crystal oscillator.

In some examples, the single-input terminal crystal oscillator includes a bias voltage generation circuit.

In some examples, the bias voltage generation circuit includes a voltage bias transistor and a current bias transistor, each of which comprises a control terminal, a first terminal and a second terminal, wherein the control terminal of the voltage bias transistor is connected to the second terminal of the current bias transistor, and is connected to the voltage input terminal of the crystal oscillator with the single terminal via the feedback resistor, the first terminal of the voltage bias transistor is respectively connected to the drain of the second MOS transistor of the single-input terminal crystal oscillator, and the first terminal of the comparator transistor of the trigger, and the second terminal of the voltage bias transistor is connected to the second terminal of the current bias transistor; the control terminal of the current bias transistor is respectively connected to the control terminal of the first MOS transistor of the crystal oscillator with the single input terminal, and the control terminal of the first bias transistor of the trigger; the first terminal of the current bias transistor is respectively connected to the source of the first MOS transistor of the single-input terminal crystal oscillator, and the first terminal of the first bias transistor of the trigger; and the second terminal of the current bias transistor is connected to the second terminal of the voltage bias transistor, and is connected to the voltage input terminal of the crystal oscillator with the single input terminal, wherein the comparator transistor of the trigger is configured to have a scaling of $N_1$ to the voltage bias transistor, $N_1$ being greater than 0; the bias transistor of the trigger is configured to have a scaling of $N_2$ to the current bias transistor, $N_2$ being greater than 0, and $N_1$ being greater than $N_2$.

In some examples, the crystal oscillator includes: an amplitude detection and adjustment circuit, wherein one terminal of the amplitude detection and adjustment circuit is respectively connected to the voltage input terminal of the crystal oscillator, and the gate of the second MOS transistor of the crystal oscillator, and the other terminal of the amplitude detection and adjustment circuit is connected to the gate of the first MOS transistor of the crystal transistor, so as to detect and adjust an amplitude after the crystal oscillator is oscillated.

In some examples, when the voltage input terminal of the crystal oscillator has no oscillation amplitude, the amplitude detection and adjustment circuit outputs a constant direct current (DC) voltage, so as to respectively supply a bias voltage to the gate of the first MOS transistor of the crystal transistor and the control terminal of the first bias transistor of the trigger; and when the amplitude of the voltage input terminal of the crystal oscillator gradually rises, the direct current voltage output by the amplitude detection and adjustment circuit rises accordingly.

The additional aspects and advantages of the present invention are partially illustrated in the following description, and the other portions would become more obvious from the following description or would be known from the practice of the present invention.

BRIEF DESCRIPTION OF THE DRAWINGS

The above and/or additional aspects and advantages of the present invention will become obvious and easier to be understand from the embodiments described with reference to the following accompanying drawings, in which.

DETAILED DESCRIPTION

The embodiments of the present invention are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present invention, which shall not be construed as causing limitations to the present invention.

A trigger and an oscillation system according to an embodiment of the present invention are described with reference to the accompanying drawings.

Figure 1:
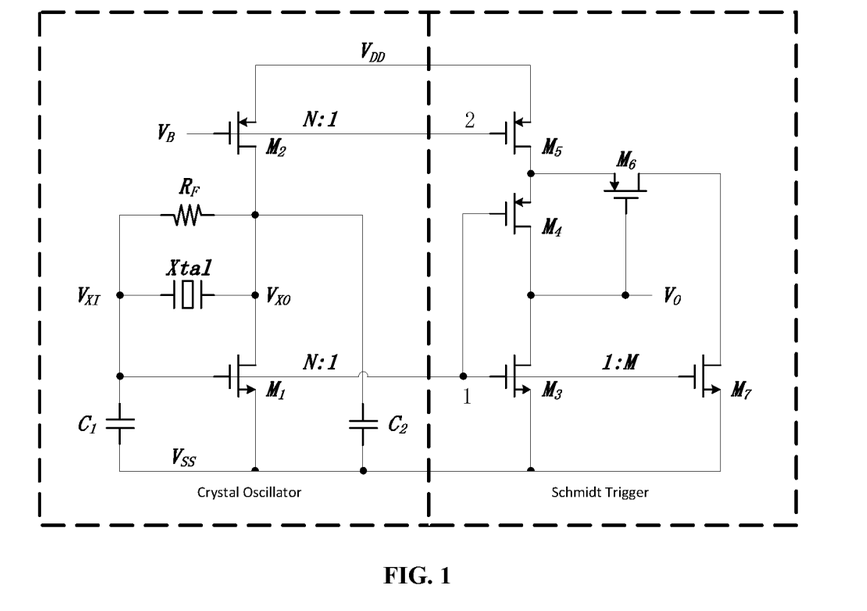
FIG. 1 is a circuit principle diagram of a trigger according to an embodiment of the present invention.

FIG. 1 is a circuit principle diagram of a trigger according to an embodiment of the present invention. As illustrated in FIG. 1, the trigger includes: a first voltage input terminal, a bias voltage input terminal, a first bias transistor, a comparator transistor, a first switch transistor, a second switch transistor, a shunt transistor and a voltage output terminal.

The first bias transistor includes a first terminal (for example, the source of a MOS transistor), a second terminal (for example, the drain of a MOS transistor) and a control terminal (for example, the gate of a MOS transistor); wherein the control terminal of the first bias transistor is connected to the bias voltage input terminal, and the first bias transistor is configured to have a scaling of N to a first component of an external device connected to the trigger, N being greater than 0. The comparator transistor includes a first terminal, a second terminal and a control terminal; wherein the control terminal of the comparator transistor is connected to the first voltage input terminal, and the comparator transistor is configured to have a scaling of N to a second component of the external device connected to the trigger. The first switch transistor and the second transistor each include a first terminal, a second terminal and a control terminal; wherein the control terminal of the first switch transistor is connected to the first voltage input terminal, the first terminal of the first switch transistor is connected to the second terminal of the first bias transistor, and the first terminal of the second switch transistor is connected to the second terminal of the first bias transistor. The shunt transistor includes a first terminal, a second terminal and a control terminal; wherein the control terminal of the shunt transistor is connected to the first voltage input terminal, the second terminal of the shunt transistor is connected to the second terminal of the second switch transistor, and the first terminal of the shunt transistor is connected to the first terminal of the comparator transistor. The shunt transistor is configured to have an enlarging scale of M to the comparator transistor, M being greater than 0. The voltage output terminal is respectively connected to the second terminal of the first switch transistor, the control terminal of the second switch transistor and the second terminal of the comparator transistor.

In an embodiment of the present invention, the external device may be, for example, a crystal oscillator, the first component is a first MOS transistor of the crystal oscillator, and the second component is a second MOS transistor of the crystal oscillator. For example, as illustrated in FIG. 1, the first MOS transistor is $M_2$ in FIG. 1, and the second MOS transistor is $M_1$ in FIG. 1. With reference to FIG. 1, the first bias transistor is configured to have a scaling of N to the first MOS transistor $M_2$ (for example, a bias transistor), and the comparator transistor of the trigger is configured to have a scaling of N to an equivalent resistor between the gate and the drain of the second transistor $M_1$ of the crystal oscillator in FIG. 1. Further, in another embodiment of the present invention, the first component may also be a current bias transistor of the bias voltage generation circuit of the crystal oscillator, and the second component may be, for example, a voltage bias transistor of the bias voltage generation circuit.

In the trigger according to an embodiment of the present invention, the bias transistor and the comparator transistor are configured to respectively scale the first MOS transistor and a negative resistance transistor in an equal proportion, to determine a neutral-point flipped voltage. Afterwards, a proportion of the shunt transistor and a comparator transistor is set to adjust the hysteresis feature of the trigger and the duty cycle of the output clock of the oscillator, such that a clock output with high noise margin and with the duty cycle approaching 50% can be finally acquired. Therefore, power consumption of the trigger may be reduced, interference caused by the peak current to other modules may be eliminated, the hysteresis interval can be easily controlled, and especially a good rectification effect can be achieved for the duty cycle of the crystal oscillator having a current mirror structure. That is, the advantages of low power consumption, less interference, adjustable hysteresis feature, rectifiable duty cycle and insensitivity to the manufacture process can be achieved.

Specifically, in the example illustrated in FIG. 1, for example, the trigger is a Schmitt trigger. The Schmitt trigger is connected to a crystal oscillator, that is, the first component of the external device connected to the Schmitt trigger is the first MOS transistor $M_2$ of the crystal oscillator, and the second component is the second MOS transistor $M_1$ of the crystal oscillator. With reference to FIG. 1, the Schmitt trigger includes: a first voltage input terminal 1, a bias voltage input terminal 2, a first bias transistor $M_5$, a comparator transistor $M_3$, a first switch transistor $M_4$, a second switch transistor $M_6$, a shunt transistor $M_7$ and a voltage output terminal $V_O$.

A control terminal of the first bias transistor $M_5$ is connected to the bias voltage input terminal 2, and the first bias transistor $M_5$ is configured to have a scaling of N to the first MOS transistor $M_2$ of the crystal oscillator connected to the Schmitt trigger, N being a decimal or integer greater than 0. The comparator transistor $M_3$ includes a first terminal, a second terminal and a control terminal; wherein the control terminal (for example, the gate thereof) is connected to the first voltage input terminal 1, and the comparator transistor $M_3$ is configured to have a scaling of N to the second MOS transistor $M_1$ of the crystal oscillator connected to the Schmitt trigger, wherein N is a decimal or integer greater than 0.

Specifically, with reference to FIG. 1, the first MOS transistor $M_2$ of the crystal oscillator generates a current according to a voltage $V_B$, and performs bias to the second MOS transistor $M_1$ of the crystal oscillator via a feedback resistance $R_F$. In this case, a direct current voltage of an input terminal voltage $V_{XI}$ of the crystal oscillator is consistent with a direct current voltage of an output terminal voltage $V_{XO}$ of the crystal oscillator, and the direct current voltage is also a flipped voltage of the crystal oscillator.

In another aspect, in this example, the first bias transistor $M_5$ and the comparator transistor $M_3$ of the Schmidt trigger respectively scale the first MOS transistor $M_2$ and the second MOS transistor $M_1$ of the crystal oscillator by an identical proportion of N times. Therefore, a flipped voltage of the Schmidt trigger is consistent with the flipped voltage of the crystal oscillator, which has nothing to do with architecture, that is, it is insensitive to the architecture. In addition, the first bias transistor $M_5$ and the comparator transistor $M_3$ respectively scale the first MOS transistor $M_2$ and the second MOS transistor $M_1$ of the crystal oscillator by N times, i.e., power consumption of the Schmidt trigger is reduced by N times, such that the power consumption of the Schmidt trigger is controllable and may be extremely low.

The first switch transistor $M_4$ and the second switch transistor $M_6$ each include a first terminal, a second terminal and a control terminal, wherein the control terminal of the first switch transistor $M_4$ is connected to the first voltage input terminal 1, the first terminal of the first switch transistor $M_4$ is connected to the second terminal of the first bias transistor $M_5$, and the first terminal of the second switch transistor $M_6$ is connected to the second terminal of the first bias transistor M5. In some examples, the first bias transistor $M_5$, the first switch transistor $M_4$ and the second switch transistor $M_6$ are n-channel MOS transistors, and then the first terminal is the source of a MOS transistor, the second terminal is the drain of a MOS transistor and the control terminal is the gate of a MOS transistor.

The shunt transistor $M_7$ includes a first terminal, a second terminal and a control terminal; wherein the control terminal of the shunt transistor $M_7$ is connected to the first voltage input terminal 1, the second terminal of the shunt transistor $M_7$ is connected to the second terminal of the second switch transistor $M_6$, the first terminal of the shunt transistor $M_7$ is connected to the first terminal of the comparator transistor $M_3$, and the shunt transistor $M_7$ is configured to have an enlarging scale of M to the comparator transistor $M_3$, M being a decimal or integer greater than 0. In some examples, the comparator transistor $M_3$ and the shunt transistor $M_7$ are both p-channel MOS transistors, and then the first terminal is the source of a MOS transistor, the second terminal is the drain of a MOS transistor and the control terminal is the gate of a MOS transistor.

The voltage output terminal $V_O$ is respectively connected to the second terminal of the first switch transistor $M_4$, the control terminal of the second switch transistor $M_6$ and the second terminal of the comparator transistor $M_3$.

For ease of understanding, specific circuit principles of the Schmidt trigger are hereinafter described with reference to FIG. 1. With reference to FIG. 1, assume that the input terminal voltage $V_{XI}$ of the crystal oscillator at an initial time is a low level. In this case, the first switch transistor $M_4$ is switched on, and the comparator transistor $M_3$ is closed; and the output terminal voltage $V_O$ of the Schmidt trigger is 1, and the second switch transistor $M_6$ is switched off. Afterwards, the input terminal voltage $V_{XI}$ of the crystal oscillator gradually rises, and the comparator transistor $M_3$ gradually pumps the current downwards. When a flipped voltage is reached, the output terminal voltage $V_O$ of the Schmidt trigger is 0. In this case, the second switch transistor $M_6$ is switched on, and the shunt transistor $M_7$ shunts a current flowing through the comparator transistor $M_3$. Further, the input terminal voltage $V_{XI}$ of the crystal oscillator continuously rises until the first switch transistor $M_4$ is cut off, and the current of the first bias transistor $M_5$ totally flows through the shunt transistor $M_7$.

Afterwards, the input terminal voltage $V_{XI}$ of the crystal oscillator is gradually reduced, and the first switch transistor $M_4$ is switched on. Since the shunt transistor $M_7$ shunts the current flowing through the comparator transistor $M_3$, the flipped voltage of the comparator transistor $M_3$ is reduced, that is, the Schmidt trigger is subjected to flipping when $V_{XI}$ is reduced to be below the flipped voltage of the transistor oscillator, thereby supplying a downward hysteresis feature.

Therefore, the hysteresis feature may be adjusted by adjusting a scaling of the shunt transistor $M_7$ to the comparator transistor $M_3$ (for example, the shunt transistor $M_7$ is configured to have an enlarging scale of M to the comparator transistor $M_3$). The output terminal voltage $V_O$ changes from 0 to 1 after the Schmidt trigger is flipped, and the second switch transistor $M_6$ is cut off. Afterwards, the input terminal voltage $V_{XI}$ of the crystal oscillator is continuously reduced before the comparator transistor $M_3$ is closed, and the first bias transistor $M_5$ enters a linear region, such that the current power consumption of the Schmidt trigger becomes 0. Therefore, ideally, the Schmidt trigger has constant current power consumption only in half of a cycle, and has no peak current, such that the power consumption of this structure is extremely low and will not cause interference to other circuits. In addition, since an output load of the Schmidt trigger is small (the size of the $M_6$ is very small), an output edge of the Schmidt trigger is relatively steep, such that power consumption of a next level buffer is reduced, thereby lowering the entire power consumption.

In addition, when oscillation of the crystal oscillator is stabilized, since the oscillation amplitude of the input terminal voltage $V_{XI}$ is large, the second MOS transistor $M_1$ operates in a state of large-signal. If the neutral-point voltage of $V_{XI}$ is not changed, the current flowing through the second MOS transistor $M_1$ becomes greater due to non-linearity, and finally the voltage of $V_{XO}$ is reduced. However, due to the effect of the feedback resistor $R_F$, the neutral-point voltage of $V_{XI}$ is lowered, such that the average current of the second MOS transistor $M_1$ is equal to the bias current provided by the bias transistor $M_2$. It should be noted that, since the Schmitt trigger according to the embodiment of the present invention has a downward hysteresis feature, the hysteresis interval rightly compensates for the problem that the neutral-point voltage of $V_{XI}$ is lowered due to non-linearity, and thus the duty cycle of the oscillator is rectified.

In conclusion, in the Schmitt trigger according to an embodiment of the present invention, the bias transistor and the comparator of the trigger are configured to respectively scale a first MOS transistor (a bias transistor) and a second MOS transistor of the oscillator in an identical proportion, to determine a neutral-point flipped voltage. Then a proportion of the shunt transistor and the comparator transistor is set to adjust the hysteretic feature of the Schmitt trigger and the duty cycle of the output clock of the oscillator, such that a clock output with high noise margin and with the duty cycle approaching 50% is finally acquired. Therefore, power consumption of the Schmitt trigger may be reduced, interference caused by the peak current to other modules is eliminated, the hysteresis interval is simply controlled, and especially a good rectification effect is achieved for the duty cycle of the crystal oscillator having a current mirror structure. That is, the advantages of low power consumption, less interference, adjustable hysteresis feature, rectifiable duty cycle and insensitivity to the process are achieved.

An embodiment of the present invention provides an oscillation system.

Specifically, the crystal oscillation system includes an oscillator and a trigger. The trigger, for example, may be the trigger as described in the above embodiment of the present invention, wherein a first voltage input terminal 1 of the trigger is connected to a voltage input terminal of the oscillator.

Specifically, the trigger, for example, may be the Schmitt trigger as described with reference to FIG. 1 in the above embodiment of the present invention. Referring to FIG. 1, when a voltage $V_{XI}$ of the voltage input terminal of the oscillator is a low level signal, a first switch transistor $M_4$ is switched on, a comparator transistor $M_3$ is switched off, the Schmidt trigger outputs a high level signal, and a second switch transistor $M_6$ is switched off.

When the voltage $V_{XI}$ of the voltage input terminal of the oscillator rises to a first voltage, that is, the voltage $V_{XI}$ of the voltage input terminal gradually rises, the comparator transistor $M_3$ gradually pumps the current downwards. When a flipped voltage is reached, the Schmidt trigger outputs a low level signal, the second switch transistor $M_6$ is switched on, and a shunt transistor $M_7$ shunts the comparator transistor $M_3$.

When the voltage $V_{XI}$ of the voltage input terminal of the oscillator rises to a second voltage, that is, the voltage $V_{XI}$ of the voltage input terminal continuously rises, the first switch transistor $M_4$ is switched off, and the shunt transistor $M_7$ shunts a first bias transistor $M_5$, wherein the second voltage is greater than the first voltage.

When the voltage $V_{XI}$ of the voltage input terminal of the oscillator gradually is reduced, the first switch transistor $M_4$ is switched on, and the shunt transistor $M_7$ shunts the comparator transistor $M_3$ to reduce the flipped voltage of the comparator transistor $M_3$, that is, the Schmidt trigger is subjected to flipping when $V_{XI}$ is reduced to be below the flipped voltage of the oscillator, thereby supplying a downward hysteresis feature. Therefore, the hysteresis feature may be adjusted by adjusting a scaling of the shunt transistor $M_7$ to the comparator transistor $M_3$ (for example, the shunt transistor $M_7$ is configured to have an enlarging scale of M to the comparator transistor $M_3$). The output terminal voltage $V_O$ changes from 0 to 1 after the Schmidt trigger is flipped, and the second switch transistor $M_6$ is disconnected. Afterwards, the input terminal voltage $V_{XI}$ of the oscillator is continuously reduced before the comparator transistor $M_3$ is closed, and the first bias transistor $M_5$ enters a linear region, such that the current power consumption of the Schmidt trigger becomes 0. Therefore, ideally, the Schmidt trigger has constant current power consumption only in half of a cycle, and has no peak current, such that the power consumption of this structure is extremely low and will not cause interference to other circuits. In addition, since an output load of the Schmidt trigger is small (the size of the $M_6$ is very small), an output edge of the Schmidt trigger is relatively steep, such that power consumption of a next level buffer is reduced, thereby lowering the entire power consumption.

In addition, the oscillation system according to an embodiment of the present invention further includes, for example, a feedback resistance $R_F$. As illustrated in FIG. 1, one terminal of the feedback resistance $R_F$ is connected to the voltage input terminal of the oscillator, and the other terminal of the feedback resistance $R_F$ is respectively connected to a voltage output terminal of the oscillator and the drain of the second MOS transistor $M_1$ of the oscillator. When a voltage $V_{XO}$ of the voltage output terminal of the oscillator is reduced, the feedback resistance $R_F$ controls a neutral-point voltage of the voltage input terminal of the oscillator to be reduced, such that an average current of a second MOS transistor $M_1$ of the oscillator is equal to a bias current of a first MOS transistor $M_2$. Specifically, when oscillation of the oscillator is stabilized, since the oscillation amplitude of the input terminal voltage $V_{XI}$ is large, the second MOS transistor operates in a state of large-signal. If the neutral-point voltage of $V_{XI}$ is not changed, the current flowing through the second MOS transistor becomes greater due to non-linearity, and finally the voltage of $V_{XO}$ is reduced. However, due to the effect of the feedback resistor $R_F$, the neutral-point voltage of $V_{XI}$ is lowered, such that the average current of the second MOS transistor $M_1$ is equal to the bias current provided by the bias transistor $M_2$. It should be noted that, since the Schmitt trigger according to the embodiment of the present invention has a downward hysteresis feature, the hysteresis interval rightly compensates for the problem that the neutral-point voltage of $V_{XI}$ is lowered due to non-linearity, and thus the duty cycle of the oscillator is rectified.

In an embodiment of the present invention, the above oscillation system may be, for example, a crystal oscillation system, and the above oscillator may be, for example, a crystal oscillator. More specifically, the crystal oscillator may be, for example, a double-pin crystal oscillator (a double-input terminal crystal oscillator, that is, a crystal oscillator having two input terminals) or a single-pin crystal oscillator (a single-input terminal crystal oscillator, that is, a crystal oscillator having one input terminal).

The oscillation system according to the above embodiment of the present invention is described in detail with reference to the accompanying drawings and specific examples.

Figure 3:
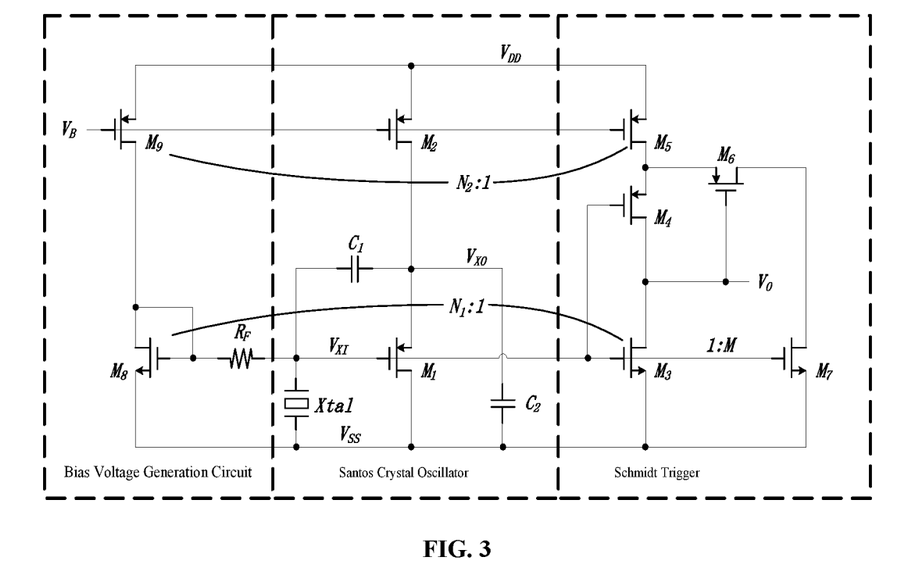
FIG. 3 is a circuit principle diagram of an oscillation system employing a single-pin crystal oscillator according to an embodiment of the present invention.

As illustrated in FIG. 3, a circuit principle diagram of an oscillation system employing a single-pin crystal oscillator is illustrated. The single-pin crystal oscillator may be, for example, a Santos crystal oscillator having a bias voltage generation circuit, wherein the Santos crystal oscillator features N-type input. The bias voltage generation circuit includes a voltage bias transistor $M_8$ and a current bias transistor $M_9$. The voltage bias transistor $M_8$ and current bias transistor $M_9$ each include a control terminal, a first terminal and a second terminal. The control terminal (the gate) of the voltage bias transistor $M_8$ is respectively connected to the second terminal (the drain) of the current bias transistor $M_8$ and connected to the voltage input terminal of the single-pin crystal oscillator via the feedback resistor $R_F$; the first terminal (the source) of the voltage bias transistor $M_8$ is respectively connected to the drain of the second MOS transistor $M_1$ of the single-pin crystal oscillator $M_1$ and the first terminal of the comparator transistor $M_3$ of the Schmitt trigger; and the second terminal of the voltage bias transistor $M_8$ is connected to the second terminal of the current bias transistor $M_9$. The control terminal of the current bias transistor $M_9$ is respectively connected to the gate of the first MOS transistor $M_2$ of the single-pin crystal oscillator and the control terminal of the first bias transistor $M_5$ of the Schmitt trigger; the first terminal of the current bias transistor $M_9$ is respectively connected to the source of the first MOS transistor $M_2$ of the single-pin crystal oscillator and the first terminal of the first bias transistor $M_5$ of the Schmitt trigger; the second terminal of the current bias transistor $M_9$ is respectively connected to the second terminal of the voltage bias transistor $M_8$ and the voltage input terminal of the single-pin crystal oscillator via the feedback resistor $R_F$. The comparator transistor $M_3$ of the Schmitt trigger is configured to have a scaling of $N_1$ to the voltage bias transistor $M_8$, $N_1$ being greater than 0, and the bias transistor $M_5$ of the Schmitt trigger is configured to have a scaling of $N_2$ to the current bias transistor $M_9$, wherein $N_2$ is greater than 0 and $N_1$ is greater than $N_2$.

Specifically, as illustrated in FIG. 3, the comparator transistor $M_3$ does not mirror the second MOS transistor $M_1$, but mirrors the voltage bias transistor $M_8$ of the second MOS transistor $M_1$. The bias transistor $M_5$ of the Schmitt trigger mirrors the current bias transistor $M_9$ of the bias voltage generation circuit of the Santos crystal oscillator. Herein it should be noted that a ratio of $M_3$ to $M_8$ is $N_1$, and a ratio of $M_5$ to $M_9$ is $N_2$, wherein $N_1$ is a little bit greater than $N_2$. Since the Schmitt trigger has a downward hysteresis feature, such configuration that $N_1$ is a little bit greater than $N_2$ may improve the neutral-point flipped voltage of the Schmitt trigger, and thus improve the duty cycle output by the oscillator.

Figure 2:
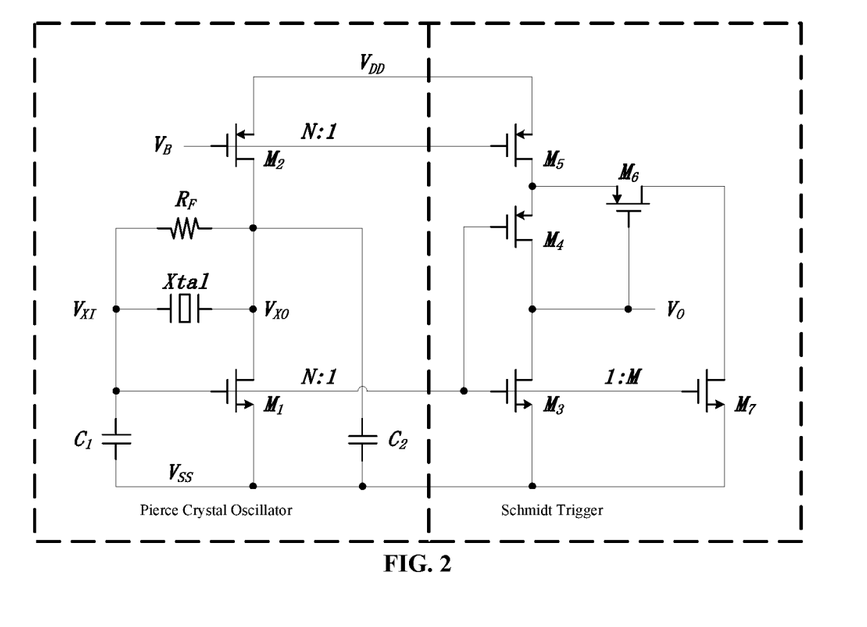
FIG. 2 is a circuit principle diagram of an oscillation system employing a double-pin crystal oscillator according to an embodiment of the present invention.
Figure 4:
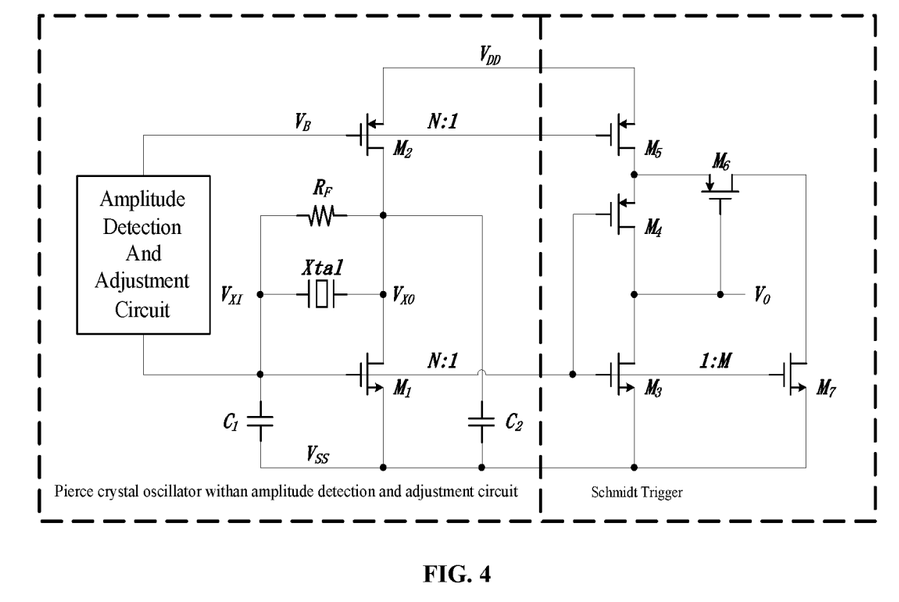
FIG. 4 is a circuit principle diagram of an oscillation system employing a double-pin crystal oscillator having an amplitude detection circuit according to an embodiment of the present invention.

As illustrated in FIG. 2, a circuit principle diagram of an oscillation system employing a double-pin crystal oscillator is illustrated, wherein the double-pin crystal oscillator may be, for example, a Pierce crystal oscillator which features N-type input. More specifically, FIG. 4 illustrates an oscillation system employing a Pierce crystal oscillator having an amplitude detection and adjustment circuit. One terminal of the amplitude detection and adjustment circuit is respectively connected to the voltage input terminal of the double-pin crystal oscillator and the gate of the second MOS transistor $M_1$ of the double-pin crystal oscillator, and the other terminal of the amplitude detection and adjustment circuit is connected to the gate of the first MOS transistor $M_2$ to detect and rectify the amplitude upon oscillation of the oscillator. When the voltage input terminal of the crystal oscillator has no oscillation amplitude, the amplitude detection and adjustment circuit outputs a constant direct current voltage, so as to respectively supply a bias voltage to the gate of the first MOS transistor of the crystal transistor and the control terminal of the first bias transistor of the trigger; and when the amplitude of the voltage input terminal of the crystal oscillator gradually rises, the direct current voltage output by the amplitude detection and adjustment circuit rises accordingly.

Specifically, as illustrated in FIG. 4, the amplitude detection and adjustment circuit and the Pierce crystal oscillator form an amplitude control loop, to adaptively control the amplitude upon stabilization of oscillation of the oscillator. The working principles of the loop is: when input terminal $V_{XI}$ of the oscillator has no oscillation amplitude, the amplitude detection and adjustment circuit outputs a constant direct current voltage $V_B$ to respectively supply a bias voltage to the gate of the first MOS transistor $M_2$ of the crystal oscillator and the gate of the first bias transistor $M_5$, and then with the increase of the amplitude of $V_{XI}$, the output voltage $V_B$ of the amplitude detection and adjustment circuit gradually increases, and the bias current of the second MOS transistor $M_1$ of the crystal oscillator decreases accordingly, such that the equivalent resistance of the second MOS transistor $M_1$ is reduced. Since the equivalent negative resistance of the second MOS transistor $M_1$ is reduced, the amplitude of the input terminal $V_{XI}$ of the crystal oscillator is reduced, and finally, the entire loop maintains $V_{XI}$ to a relatively constant oscillation amplitude.

It should be noted that since the amplitude control loop causes the bias current of the crystal oscillator to be reduced, which indirectly results in that the bias voltage (the flipped voltage) of the $M_1$ transistor is changed. The bias current of the Schmidt trigger according to the embodiment of the present invention is related to the crystal oscillator, and as such, the duty cycle, hysteresis feature and the like of the Schmidt trigger are not subjected to change with the reduction of the power consumption, which has a high robustness.

Figure 5:
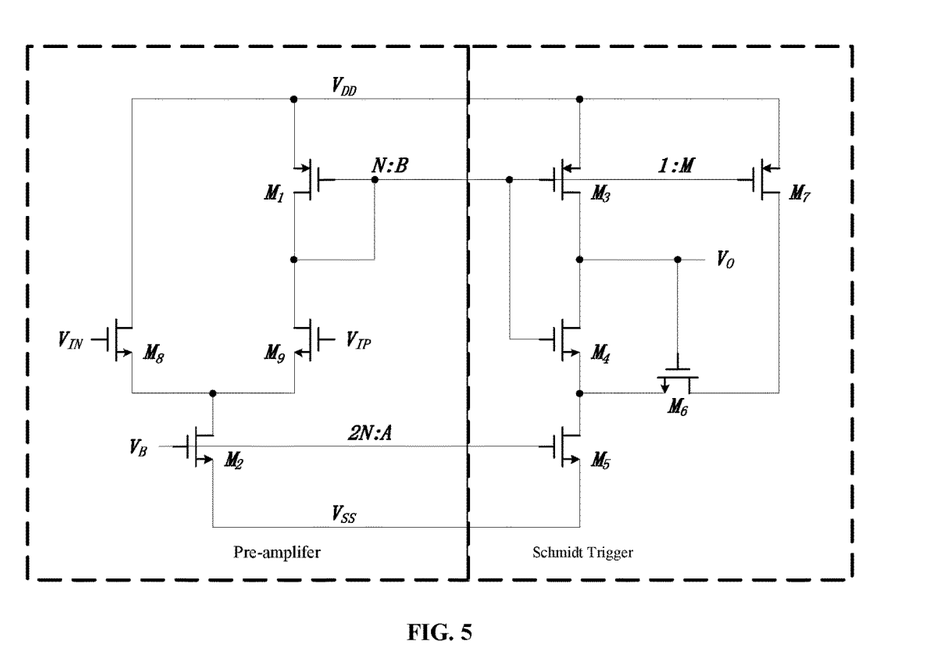
FIG. 5 is a circuit principle diagram of an oscillation system employing an open-loop comparator structure according to an embodiment of the present invention.

Further, in the example as illustrated in FIG. 5, the oscillation system employing a differential input and single-terminal output open-loop comparator structure of high noise margin is illustrated, wherein the open-loop comparator has P-type input. In this example, for ease of functionality description, it is assumed herein that A=B, the bias voltage $V_B$ supplies a gate voltage bias to the current bias transistors $M_2$ and $M_5$, such that current bias transistors $M_2$ and $M_5$ generate the bias current in a proportion of 2N:1. It is assumed herein that the bias current of $M_2$ is $2I_b$, the bias current of $M_5$ is $A\,I_b/N$. In this case, if the voltage of the positive input terminal $V_{IP}$ is greater than the negative input terminal $V_{IN}$, thus the current flowing through the second MOS transistor $M_1$ is greater than $I_b$. Since the input transistor $M_3$ of the Schmitt trigger mirrors the current of the transistor $M_1$, the current flowing through the transistor $M_3$ is greater than $B\,I_b/N$, that is, greater than the bias current $A\,I_b/N$ of the bias transistor $M_5$, the comparator outputs a high level (VDD). Analogously, if the voltage of the positive input terminal $V_{IP}$ is less than the negative input terminal $V_{IN}$, the comparator outputs a low level (VSS). The principle of the hysteresis feature is consistent with the description in the example as illustrated in FIG. 2. It should be noted herein that: the relationship between A, B and M needs to satisfy the formula of 2B(M+1)>A to prevent an amplifier from flipping.

In conclusion, in the oscillation system according to an embodiment of the present invention, the first bias transistor and the comparator of the Schmitt trigger are configured to respectively scale a first MOS transistor and a second MOS transistor of the oscillator in an identical proportion, to determine a neutral-point flipped voltage. Afterwards, a proportion of a shunt transistor and a comparator transistor is set to adjust the hysteresis feature of the trigger (for example, a Schmitt trigger) and the duty cycle of the output clock of the oscillator, such that a clock output with high noise margin and with the duty cycle approaching 50% is finally acquired. Therefore, power consumption of the trigger may be reduced, interference caused by the peak current to other modules is eliminated, the hysteresis interval is simply controlled, and especially a good rectification effect is achieved for the duty cycle of the crystal oscillator having a current mirror structure. That is, the advantages of low power consumption, less interference, adjustable hysteresis feature, rectifiable duty cycle and insensitivity to the process are achieved.

The following examples are provided according to some embodiments of the present invention.

EXAMPLE 1

A trigger which includes:
a first voltage input terminal;
a bias voltage input terminal;
a first bias transistor which comprises a first terminal, a second terminal and a control terminal, wherein the control terminal of the first bias transistor is connected to the bias voltage input terminal, and the first bias transistor is configured to have a scaling of N to a first component of an external device connected to the trigger, N being greater than 0;
a comparator transistor which comprises a first terminal, a second terminal and a control terminal, wherein the control terminal of the comparator transistor is connected to the first voltage input terminal, and the comparator transistor is configured to have a scaling of N to a second component of the external device connected to the trigger;
a first switch transistor and a second switch transistor, each of which comprises a first terminal, a second terminal and a control terminal, wherein the control terminal of the first switch transistor is connected to the first voltage input terminal, the first terminal of the first switch transistor is connected to the second terminal of the first bias transistor, and the first terminal of the second switch transistor is connected to the second terminal of the first bias transistor;

a shunt transistor which comprises a first terminal, a second terminal and a control terminal, wherein the control terminal of the shunt transistor is connected to the first voltage input terminal, the second terminal of the shunt transistor is connected to the second terminal of the second switch transistor, the first terminal of the shunt transistor is connected to the first terminal of the comparator transistor, and the shunt transistor is configured to have an enlarging scale of M to the comparator transistor, M being greater than 0; and a voltage output terminal, wherein the voltage output terminal is respectively connected to the second terminal of the first switch transistor, the control terminal of the second switch transistor and the second terminal of the comparator transistor.

EXAMPLE 2

The trigger according to Example 1, wherein the external circuit is a crystal oscillator circuit, the first component is a first metal-oxide-semiconductor (MOS) transistor of the crystal oscillator, and the second component is a second MOS transistor of the crystal oscillator.

EXAMPLE 3

The trigger according to Example 1 or 2, wherein the external device is a bias voltage generation circuit of the crystal oscillator, the first component is a current bias transistor of the bias voltage generation circuit, and the second component is a voltage bias transistor of the bias voltage generation circuit.

EXAMPLE 4

The trigger according to Example 1, 2 or 3, wherein the first bias transistor, the first switch transistor and the second switch transistor are n-channel MOS transistors.

EXAMPLE 5

The trigger according to Example 1, wherein the comparator transistor and the shunt transistor are p-channel MOS transistors.

EXAMPLE 6

An oscillation system which includes:
an oscillator; and
a trigger, wherein the trigger is the trigger as defined in any one of Examples 1 to 5, a first voltage input terminal of the trigger being connected to a voltage input terminal of the oscillator.

EXAMPLE 7

The oscillation system according to Example 6, wherein when a voltage of the voltage input terminal of the oscillator is a low level signal, the first switch transistor is switched on, the comparator transistor is switched off, the trigger outputs a high level signal, and the second switch transistor is switched off;
when the voltage of the voltage input terminal of the oscillator rises to a first voltage, the trigger outputs a low level signal, the second switch transistor is switched on, and the shunt transistor shunts the comparator transistor;
when the voltage of the voltage input terminal of the oscillator rises to a second voltage, the first switch transistor is switched off, and the shunt transistor shunts the first bias transistor, wherein the second voltage is greater than the first voltage; and
when the voltage of the voltage input terminal of the oscillator gradually reduces from the second voltage, the first switch transistor is switched on, and the shunt transistor shunts the comparator transistor to reduce a flipped voltage of the comparator transistor.

EXAMPLE 8

The oscillation system according to Example 7, further including:
a feedback resistor, wherein one terminal of the feedback resistor is connected to the voltage input terminal of the oscillator, and the other terminal of the feedback resistor is connected to a voltage output terminal of the oscillator and the drain of the second MOS transistor of the oscillator.

EXAMPLE 9

The oscillation system according to any one of Examples 6 to 8, wherein the oscillation system is a crystal oscillation system, and the oscillator is a crystal oscillator.

EXAMPLE 10

The oscillation system according to Example 9, wherein the crystal oscillator is a double-input terminal crystal oscillator or a single-input terminal crystal oscillator.

EXAMPLE 11

The oscillation system according to Example 10, wherein the single-pin crystal oscillator includes a bias voltage generation circuit.

EXAMPLE 12

The oscillation system according to Example 11, wherein the bias voltage generation circuit includes a voltage bias transistor and a current bias transistor, each of which comprises a control terminal, a first terminal and a second terminal, wherein
the control terminal of the voltage bias transistor is connected to the second terminal of the current bias transistor, and is connected to the voltage input terminal of the single-input terminal crystal oscillator via the feedback resistance, the first terminal of the voltage bias transistor is respectively connected to the drain of the second MOS transistor of the single-input terminal crystal oscillator, and the first terminal of the comparator transistor of the trigger, and the second terminal of the voltage bias transistor is connected to the second terminal of the current bias transistor;
the control terminal of the current bias transistor is respectively connected to the gate of the first MOS transistor of the single-input terminal crystal oscillator, and the control terminal of the first bias transistor of the trigger; the first terminal of the current bias transistor is respectively connected to the source of the first MOS transistor of the single-input terminal crystal oscillator, and the first terminal of the first bias transistor of the trigger; and the second terminal of the current bias transistor is connected to the second terminal of the voltage bias transistor, and is connected to the voltage input terminal of the single-input terminal crystal oscillator via the feedback resistor, wherein the comparator transistor of the trigger is configured to have a scaling of $N_1$ to the voltage bias transistor, $N_1$ being greater than 0;

the bias transistor of the trigger is configured to have a scaling of $N_2$ to the current bias transistor, $N_2$ being greater than 0, and $N_1$ being greater than $N_2$.

EXAMPLE 13

The oscillation system according to any one of the Example 10 to 12, wherein the crystal oscillator includes:

an amplitude detection and adjustment circuit, wherein one terminal of the amplitude detection and adjustment circuit is respectively connected to the voltage input terminal of the crystal oscillator, and the gate of the second MOS transistor of the crystal oscillator, and the other terminal of the amplitude detection and adjustment circuit is connected to the gate of the first MOS transistor of the crystal transistor, so as to detect and adjust an amplitude after the crystal oscillator is oscillated.

EXAMPLE 14

The oscillation system according to Example 13, wherein when the voltage input terminal of the crystal oscillator has no oscillation amplitude, the amplitude detection and adjustment circuit outputs a constant direct current voltage, so as to respectively supply a bias voltage to the gate of the first MOS transistor of the crystal transistor and the control terminal of the first bias transistor of the trigger according to the direct current voltage; and when the amplitude of the voltage input terminal of the crystal oscillator gradually rises, the direct current voltage output by the amplitude detection and adjustment circuit rises accordingly.

In the description of some embodiments of the present invention, it should be understood that the terms "central", "transversal", "longitudinal", "length", "width", "thickness", "upper", "lower", "front", "rear", "left", "right", "vertical", "horizontal", "top", "bottom", "inner", "outer", "clockwise", "counterclockwise", "axial", "radial", "circumferential" and the like indicate orientations and position relationships which are based on the illustrations in the accompanying drawings, and these terms are merely for ease and brevity of the description, instead of indicating or implying that the devices or elements shall have a particular orientation and shall be structured and operated based on the particular orientation. Accordingly, these terms shall not be construed as limiting the present invention.

In addition, terms of "first", "second" are only used for description, but shall not be understood as indication or implication of relative importance or implicit indication of the number of the specific technical features. Therefore, the features defined by the terms "first" and "second" may explicitly or implicitly comprise at least one of these features. In the description of the present invention, the term "more" or "a plurality of" signifies at least two, unless otherwise specified.

In the description of the present invention, it should be noted that unless otherwise specified and defined, the terms "mounted", "coupled", "connected" and "fixed" and derivative forms thereof shall be understood in a broad sense, which, for example, may be understood as fixed connection, detachable connection or integral connection; may be understood as mechanical connection or electrical connection, or understood as direct connection, indirect connection via a neutral-point medium, or communication between the interiors of two elements or interactions between two elements, unless otherwise specified. Persons of ordinary skill in the art may understand the specific meanings of the above terms in the present invention according to the actual circumstances and contexts.

In the present invention, unless otherwise specified or defined, by defining that a first feature is arranged "above" or "below" or "beneath" a second feature, it may be meant that the first feature is in direct contact with the second feature, or the first feature is in indirect contact with the second feature via a neutral-point medium. In addition, by defining that a first feature is arranged "over" or "above" a second feature, it may be meant that the first feature is rightly over the second feature or is obliquely above the second feature, or the horizontal height of the first feature is greater than that of the second feature. In addition, by defining that a first feature is arranged "under" or "below, or "beneath" a second feature, it may be meant that the first feature is rightly under the second feature or is obliquely below the second feature, or the horizontal height of the first feature is less than that of the second feature.

In the description of the present specification, reference terms such as "an embodiment", "some embodiments", "examples", "specific examples", "some examples", or the like are intended to refer to that the specific features, structures, materials, or characteristics which are described in combination with the embodiments or examples are included in at least one embodiment or example of the present invention. In this specification, schematic expressions of the above terms do not necessarily indicate the same embodiments or examples. In addition, the described specific features, structures, materials, or characteristics may be combined in any one or multiple embodiments or examples in a suitable way. In addition, in case of no contradiction, a person skilled in the art may incorporate or combine different embodiments or examples and features of different embodiments or examples described in this specification.

Although the above description illustrates the embodiments of the present invention, it can be understood that the embodiments are merely exemplary, and shall not be construed as limitations to the present invention. Persons of ordinary skill in the art may derive variations, modifications, and replacements to the above embodiments within the scope of the present invention.

What is claimed is:

1. A trigger, comprising:
   a first voltage input terminal;
   a bias voltage input terminal;
   a first bias transistor comprising a first terminal, a second terminal and a control terminal, wherein the control terminal of the first bias transistor is connected to the bias voltage input terminal, and the first bias transistor is configured to have a scaling of N to a first component of an external circuit connected to the trigger, and N is greater than 0;
   a comparator transistor comprising a first terminal, a second terminal and a control terminal, wherein the control terminal of the comparator transistor is connected to the first voltage input terminal, and the comparator transistor is configured to have a scaling of N to a second component of the external circuit connected to the trigger;

a first switch transistor and a second switch transistor, each of which comprises a first terminal, a second terminal and a control terminal, wherein the control terminal of the first switch transistor is connected to the first voltage input terminal, the first terminal of the first switch transistor is connected to the second terminal of the first bias transistor, and the first terminal of the second switch transistor is connected to the second terminal of the first bias transistor;

a shunt transistor which comprises a first terminal, a second terminal and a control terminal, wherein the control terminal of the shunt transistor is connected to the first voltage input terminal, the second terminal of the shunt transistor is connected to the second terminal of the second switch transistor, the first terminal of the shunt transistor is connected to the first terminal of the comparator transistor, and the shunt transistor is configured to have an enlarging scale of M to the comparator transistor, M being greater than 0; and a voltage output terminal, wherein the voltage output terminal is respectively connected to the second terminal of the first switch transistor, the control terminal of the second switch transistor and the second terminal of the comparator transistor.

2. The trigger according to claim 1, wherein the external circuit is a crystal oscillator circuit, the first component is a first MOS transistor of the crystal oscillator, and the second component is a second MOS transistor of the crystal oscillator.

3. The trigger according to claim 1, wherein the external circuit is a bias voltage generation circuit of the crystal oscillator, the first component is a current bias transistor of the bias voltage generation circuit, and the second component is a voltage bias transistor of the bias voltage generation circuit.

4. The trigger according to claim 1, wherein the first bias transistor, the first switch transistor and the second switch transistor are n-channel MOS transistors.

5. The trigger according to claim 1, wherein the comparator transistor and the shunt transistor are p-channel MOS transistors.

6. An oscillation system, comprising:
an oscillator comprising an voltage input terminal and an voltage output terminal; and
a trigger, wherein the trigger comprises:
a first voltage input terminal connected to the voltage input terminal of the oscillator;
a bias voltage input terminal;
a first bias transistor comprising a first terminal, a second terminal and a control terminal, wherein the control terminal of the first bias transistor is connected to the bias voltage input terminal, and the first bias transistor is configured to have a scaling of N to a first component of the oscillator, and N is greater than 0;
a comparator transistor comprising a first terminal, a second terminal and a control terminal, wherein the control terminal of the comparator transistor is connected to the first voltage input terminal, and the comparator transistor is configured to have a scaling of N to a second component of the oscillator;
a first switch transistor and a second switch transistor, each of which comprises a first terminal, a second terminal and a control terminal, wherein the control terminal of the first switch transistor is connected to the first voltage input terminal, the first terminal of the first switch transistor is connected to the second terminal of the first bias transistor, and the first terminal of the second switch transistor is connected to the second terminal of the first bias transistor;

a shunt transistor which comprises a first terminal, a second terminal and a control terminal, wherein the control terminal of the shunt transistor is connected to the first voltage input terminal, the second terminal of the shunt transistor is connected to the second terminal of the second switch transistor, the first terminal of the shunt transistor is connected to the first terminal of the comparator transistor, and the shunt transistor is configured to have an enlarging scale of M to the comparator transistor, M being greater than 0; and a voltage output terminal, wherein the voltage output terminal is respectively connected to the second terminal of the first switch transistor, the control terminal of the second switch transistor and the second terminal of the comparator transistor.

7. The oscillation system according to claim 6, wherein
when a voltage of the voltage input terminal of the oscillator is a low level signal, the first switch transistor is switched on, the comparator transistor is switched off, the trigger outputs a high level signal, and the second switch transistor is switched off;
when the voltage of the voltage input terminal of the oscillator rises to a first voltage, the trigger outputs a low level signal, the second switch transistor is switched on, and the shunt transistor shunts the comparator transistor;
when the voltage of the voltage input terminal of the oscillator rises to a second voltage, the first switch transistor is switched off, and the shunt transistor shunts the first bias transistor, wherein the second voltage is greater than the first voltage; and
when the voltage of the voltage input terminal of the oscillator gradually reduces from the second voltage, the first switch transistor is switched on, and the shunt transistor shunts the comparator transistor to lower a flipped voltage of the comparator transistor.

8. The oscillation system according to claim 6, wherein the first component is a first MOS transistor of the crystal oscillator, and the second component is a second MOS transistor of the crystal oscillator.

9. The oscillation system according to claim 8, further comprising:
a feedback resistor, wherein one terminal of the feedback resistor is connected to the voltage input terminal of the oscillator, and the other terminal of the feedback resistor is respectively connected to the voltage output terminal of the oscillator and the drain of the second MOS transistor of the oscillator.

10. The oscillation system according to claim 8, wherein the oscillation system is a crystal oscillation system, and the oscillator is a crystal oscillator.

11. The oscillation system according to claim 10, wherein the crystal oscillator is a double-input terminal crystal oscillator or a single-input terminal crystal oscillator.

12. The oscillation system according to claim 11, wherein the single-pin crystal oscillator comprises a bias voltage generation circuit.

13. The oscillation system according to claim 12, wherein the bias voltage generation circuit comprises a voltage bias transistor and a current bias transistor, each of the voltage bias transistor and the current bias transistor comprises a control terminal, a first terminal and a second terminal, wherein:

the control terminal of the voltage bias transistor is connected to the second terminal of the current bias transistor, and is connected to the voltage input terminal of the single-input terminal crystal oscillator via the feedback resistor, the first terminal of the voltage bias transistor is respectively connected to the drain of the second MOS transistor of the single-input terminal crystal oscillator and the first terminal of the comparator transistor of the trigger, and the second terminal of the voltage bias transistor is connected to the second terminal of the current bias transistor;

the control terminal of the current bias transistor is respectively connected to the gate of the first MOS transistor of the single-input terminal crystal oscillator and the control terminal of the first bias transistor of the trigger; the first terminal of the current bias transistor is respectively connected to the source of the first MOS transistor of the single-input terminal crystal oscillator and the first terminal of the first bias transistor of the trigger; and the second terminal of the current bias transistor is connected to the second terminal of the voltage bias transistor, and is connected to the voltage input terminal of the single-input terminal crystal oscillator via the feedback resistor.

14. The oscillation system according to claim 11, wherein the crystal oscillator comprises:

an amplitude detection and adjustment circuit, wherein one terminal of the amplitude detection and adjustment circuit is respectively connected to the voltage input terminal of the crystal oscillator and the gate of the second MOS transistor of the crystal oscillator, and the other terminal of the amplitude detection and adjustment circuit is connected to the gate of the first MOS transistor of the crystal transistor, so as to detect and adjust an amplitude after the crystal oscillator is oscillated.

15. The oscillation system according to claim 14, wherein when the voltage input terminal of the crystal oscillator has no oscillation amplitude, the amplitude detection and adjustment circuit outputs a constant direct current voltage, so as to respectively supply a bias voltage to the gate of the first MOS transistor of the crystal transistor and the control terminal of the first bias transistor of the trigger according to the direct current voltage; and when the amplitude of the voltage input terminal of the crystal oscillator gradually rises, the direct current voltage output by the amplitude detection and adjustment circuit rises accordingly.

16. The oscillation system according to claim 6, wherein the oscillator further comprises a bias voltage generation circuit configured to provide a bias voltage for the oscillator, and the first component is a current bias transistor of the bias voltage generation circuit, and the second component is a voltage bias transistor of the bias voltage generation circuit.

17. The oscillation system according to claim 6, wherein all of the first bias transistor, the first switch transistor and the second switch transistor are n-channel MOS transistors or p-channel MOS transistors.

18. The oscillation system according to claim 6, wherein the first terminals are source terminals, the second terminals are drain terminals.

19. An oscillation system, comprising:

an oscillator comprising an voltage input terminal and an voltage output terminal; and a trigger, wherein the trigger comprises:

a first voltage input terminal connected to the voltage input terminal of the oscillator;

a bias voltage input terminal;

a first bias transistor comprising a first terminal, a second terminal and a control terminal, wherein the control terminal of the first bias transistor is connected to the bias voltage input terminal, and the first bias transistor is configured to have a scaling of $N_2$ to a first component of the oscillator, and $N_2$ is greater than 0;

a comparator transistor comprising a first terminal, a second terminal and a control terminal, wherein the control terminal of the comparator transistor is connected to the first voltage input terminal, and the comparator transistor is configured to have a scaling of $N_1$ to a second component of the oscillator, wherein $N_1$ is greater than $N_2$;

a first switch transistor and a second switch transistor, each of which comprises a first terminal, a second terminal and a control terminal, wherein the control terminal of the first switch transistor is connected to the first voltage input terminal, the first terminal of the first switch transistor is connected to the second terminal of the first bias transistor, and the first terminal of the second switch transistor is connected to the second terminal of the first bias transistor;

a shunt transistor which comprises a first terminal, a second terminal and a control terminal, wherein the control terminal of the shunt transistor is connected to the first voltage input terminal, the second terminal of the shunt transistor is connected to the second terminal of the second switch transistor, the first terminal of the shunt transistor is connected to the first terminal of the comparator transistor, and the shunt transistor is configured to have an enlarging scale of M to the comparator transistor, M being greater than 0; and a voltage output terminal, wherein the voltage output terminal is respectively connected to the second terminal of the first switch transistor, the control terminal of the second switch transistor and the second terminal of the comparator transistor.

20. The oscillation system according to claim 19, wherein the oscillator further comprises a bias voltage generation circuit configured to provide a bias voltage for the oscillator, and the first component is a current bias transistor of the bias voltage generation circuit, and the second component is a voltage bias transistor of the bias voltage generation circuit.

* * * * *